US007515783B2

(12) United States Patent
Kato et al.

(10) Patent No.: US 7,515,783 B2
(45) Date of Patent: Apr. 7, 2009

(54) MICRO-OPTIC DEVICE AND METHOD OF MANUFACTURING SAME

(75) Inventors: Yoshichika Kato, Tachikawa (JP); Satoshi Yoshida, Tama (JP); Keiichi Mori, Tokyo (JP); Kenji Kondou, Chofu (JP); Yoshihiko Hamada, Akiruno (JP); Osamu Imaki, Hachioji (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 876 days.

(21) Appl. No.: 10/942,583

(22) Filed: Sep. 16, 2004

(65) Prior Publication Data

US 2005/0069246 A1    Mar. 31, 2005

(30) Foreign Application Priority Data

Sep. 30, 2003    (JP)    ............................. 2003-340797

(51) Int. Cl.
*G02B 6/26* (2006.01)
(52) U.S. Cl. ........................................... 385/18; 385/16
(58) Field of Classification Search ........................ None
See application file for complete search history.

(56) References Cited

U.S. PATENT DOCUMENTS 6,315,462 B1    11/2001    Anthamatten et al.

(Continued)

FOREIGN PATENT DOCUMENTS

CN    2461012 Y    11/2001

(Continued)

OTHER PUBLICATIONS

Juan, et al.; "Controlling sidewall smoothness for micromachined Si mirrors and lenses," J. Vac. Sci. Technol. B ,14(6), Nov./Dec. 1996, pp. 4080-4084.

*Primary Examiner*—Sung H Pak
*Assistant Examiner*—Mike Stahl
(74) *Attorney, Agent, or Firm*—David N. Lathrop, Esq.; Gallagher & Lathrop

(57) ABSTRACT

A micro-optic device including a complicate structure and a movable mirror is made to be manufactured in a reduced length of time. A silicon substrate and a single crystal silicon device layer with an intermediate layer of silicon dioxide interposed therebetween defines a substrate on which a layer of mask material is formed and is patterned to form a mask having the same pattern as the configuration of the intended optical device as viewed in plan view. A surface which is to be constructed as a mirror surface is chosen to be in a plane of the silicon crystal. Using the mask, the device layer is vertically etched by a reactive ion dry etching until the intermediate layer is exposed. Subsequently, using KOH solution, a wet etching which is anisotropic to the crystallographic orientation is performed with an etching rate which is on the order of 0.1 μm/min for a time interval on the order of ten minutes is performed to convert the sidewall surface of the mirror into a smooth crystallographic surface. Subsequently, the intermediate layer is selectively subject to a wet etching to remove the intermediate layer only in an area located below the movable part of the optical device.

4 Claims, 12 Drawing Sheets

U.S. PATENT DOCUMENTS

| | | | |
|---|---|---|---|
| 6,639,713 B2 * | 10/2003 | Chiu et al. | 359/318 |
| 6,711,321 B2 * | 3/2004 | Helin et al. | 385/19 |
| 6,804,036 B1 * | 10/2004 | Chen et al. | 359/237 |
| 2003/0027370 A1 * | 2/2003 | Helin | 438/50 |
| 2003/0210853 A1 * | 11/2003 | Kato | 385/18 |
| 2004/0232106 A1 * | 11/2004 | Oka et al. | 216/26 |
| 2004/0234191 A1 * | 11/2004 | Norimatsu | 385/18 |

FOREIGN PATENT DOCUMENTS

| | | |
|---|---|---|
| CN | 1391118 A | 1/2003 |
| CN | 1402034 A | 3/2003 |
| JP | H07-001737 | 1/1995 |
| JP | 2003-029178 | 1/2003 |
| JP | 2003-149568 | 5/2003 |
| JP | 2003-177337 | 6/2003 |
| WO | WO0111411 | 2/2001 |

* cited by examiner

PRIOR ART

MICRO-OPTIC DEVICE AND METHOD OF MANUFACTURING SAME

BACKGROUND ART

The present invention relates to a micro-optic device including a mirror and a complicate structure fabricated by a deep dry etching technique such as a micro-optic device which is capable of light path switching and light intensity adjustment utilizing a mirror, and to a method of manufacturing such a device.

An optical switch has been proposed in which a technique such as a semiconductor anisotropic dry etching is used to form elements including a mirror, a hinge, an actuator and a light guide on a substrate and which has the function of switching a light path by insertion into and extraction from the light guide of the mirror.

To give a specific example, the structure of an MEMS (Micro-Electro-Mechanical System) optical switch disclosed in U.S. Pat. No. 6,315,462, issued Nov. 13, 2001, is shown in FIG. 1.

Formed in a sheet-like substrate 111 are four fiber channels 112a to 112d in a crisscross configuration. One of four areas which is defined by the fiber channels 112a and 112b represents a drive formation 111'. A slot 113 which forms an angle of 45° with each of the fiber channels 112a and 112b is formed in the drive formation 111', and a movable rod 114 is disposed in the slot 113.

At its one end, the movable rod 114 carries a mirror 115, which is positioned at an area of intersection 116 between the fiber channels 112a to 112d. Support beams 117a and 117b have their one end connected to opposites sides of the movable rod 114 intermediate the length thereof, and these support beams 117a and 117b have their other end secured to fixed supports 119a and 119b, respectively, through leaf spring hinges 118a and 118b. In a similar manner, support beams 117c and 117d have their one end connected to opposite sides of the movable rod 114 at the other end thereof. These support beams 117c and 117d have their other end secured to the fixed supports 119a and 119b, respectively, through leaf spring hinges 118c and 118d. In this manner, the movable rod 114 is supported to be movable in the lengthwise direction. It is to be noted that the leaf springs 118a, 118b, 118c and 118d are folded back upon themselves to increase the spring length.

The movable rod 114 is driven by a comb tooth type electrostatic actuator. Specifically, movable comb tooth electrodes 121a to 121d are fixedly mounted as arrays on the support beams 117a to 117d, respectively, and mate with fixed comb tooth electrodes 122a to 122d, respectively, which are fixedly mounted on the drive formation 111'. When a voltage is applied across the movable comb tooth electrodes 121a and 121b and the fixed comb tooth electrodes 122a and 122b, an electrostatic force of attraction is developed to move the movable rod 114 in a direction toward the center of the area of intersection 116. On the other hand, when a voltage is applied across the movable comb tooth electrodes 121c and 121d and the fixed comb tooth electrodes 122c and 122d, an electrostatic force of attraction is developed to move the movable rod 114 in a direction away from the center of the area of intersection 116. By driving the movable rod 114 with the comb tooth type electrostatic actuator, it is possible to insert the mirror 115 into or to extract it from the center of the area of intersection 116.

Optical fibers 123a to 123d are respectively disposed in the four fiber channels 112a to 112d. When the mirror 115 is inserted into the center of the area of intersection 116, light which is emitted from the optical fiber 123a, for example, is reflected by the mirror 115 to impinge on the optical fiber 123d, and light which is emitted from the optical fiber 123b is reflected by the mirror 115 to impinge on the optical fiber 123c. On the contrary, when the mirror is extracted from the center of the area of intersection 116, light emitted from the optical fiber 123a impinges on the optical fiber 123c, and light emitted from the optical fiber 123b impinges on the optical fiber 123d. A switching of the light path takes place in this manner.

The micro-optic switch is manufactured by the manufacturing method shown in FIG. 2. Specifically, as shown in FIG. 2A, an SOI (Silicon On Insulator) substrate 130 of a three layer construction including a single crystal silicon substrate 131, on which an insulating layer 132 formed by a silicon oxide film is formed, and a single crystal silicon layer 133 is disposed on top of the insulating layer 132 is provided. A required mask 134 is formed on the single crystal silicon layer 133 by patterning a layer of mask material. Portions of the single crystal silicon layer 133 which are exposed through the mask 134 are subject to a deep anisotropic reactive ion etching (DRIE: Deep Anisotropic Reactive Ion Etching) to remove the single crystal silicon layer 133 until the insulating layer 132 becomes exposed, as illustrated in FIG. 2B.

A narrow width portion 135 of the single crystal silicon layer 133 as viewed in FIG. 2B represents movable parts such as the movable rod 114, the support beams 117a to 117d and leaf spring hinges 118a to 118d shown in FIG. 1 while a wide width portion 136 represents a structural body such as the fixed supports 119a and 119b shown in FIG. 1 which are fixedly mounted. FIG. 2 is an exemplary illustration of these parts.

Referring to FIG. 2B, a wet etching is applied to the exposed insulating layer 132 until a portion of the insulating layer 132 which is disposed beneath the narrow width portion 135 is removed by a side etching. As a consequence, the narrow width portion 135 will be located above the single crystal silicon substrate 131 through an air gap 137, as shown in FIG. 2C. Thus, the movable part which is formed by the narrow width portion 135 as the insulating layer 132 is removed is spaced from the single crystal silicon substrate 131 and becomes movable. It should be understood that the mirror 115 is fabricated during the etching treatment of the single crystal silicon layer 133 together with the movable rod 114, the support beams 117a to 117d and the movable comb tooth electrodes 121a to 121d. Subsequent to the wet etching operation, reflective films are formed by evaporation on the lateral wall surfaces of the mirror 115, thus completing the mirror 115.

In this manner, when the anisotropic reactive ion dry etching process is utilized, a vertical etched sidewall can be formed without being influenced by the crystalline orientation of the single crystal silicon substrate 131, thus enabling a minute structure of a complicate configuration as shown in FIG. 1 to be manufactured. While a deep etching can be achieved by a wet etching which uses an etchant solution applied to the single crystal silicon layer, it is to be noted that this wet etching exhibits an anisotropic behaviour with respect to the crystalline orientation of the silicon, and therefore it is difficult to manufacture an optical device for a micro-electromechanical system having a complicate construction as illustrated by the optical switch shown in FIG. 1. For this reason, a micro-optic device of this kind has been manufactured utilizing a deep anisotropic dry etching which utilizes a reactive ion.

However, when a deep anisotropic reactive ion etching is applied to the single crystal silicon substrate 131 so that a deep vertical etched sidewall surface can be obtained, there results an unevenness which is in excess of the order of 100 nm on the etched sidewall surface. If an etched sidewall surface having such an unevenness is used as a mirror surface for the movable mirror 115, the mirror cannot have a favorable reflection response. According to a technology disclosed in the patent literature: International Laid-Open Number WO 01/01 1411, Internationally Laid Open Feb. 15, 2001, prior to the deep anisotropic reactive ion etching, sacrificial raised layer masks 134b are formed close to and on the opposite side of a mask 134a on a portion 115a of the single crystal silicon layer 133 where the mirror 115 is subsequently to be formed in a manner completely separate from masks 134c which are associated with wide width portions 136. When the deep anisotropic reactive ion etching takes place subsequently, sacrificial raised layers 138 are formed on the opposite sides of the masked portion 115a in closely adjacent and parallel relationship threrwith. As shown in FIG. 3B, the single crystal silicon layer 133 is immersed into an etchant 139, whereby movable parts inclusive of the mirror portion 115a are free to move relative to the single crystal silicon substrate 131. At this time, the sacrificial raised layers 138 are removed without being connected to any fixing part. By choosing such a technology, the both sidewall surfaces of the mirror portion 115a can be made to be more smooth surfaces as compared with the surfaces which are obtained without forming the sacrificial raised surfaces 138, with an unevenness on the order of 30 nm or less.

However, it will be noted that there are a number of closely spaced parts such as individual comb teeth of the comb tooth electrodes 121a to 121d and 122a to 122d and folded back portions of the leafed spring hinges 118a to 118d which are closely spaced from each other. In particular, the insulating layer 132 has a thickness which is normally on the order of 3 μm at most, and the air gap between these movable parts and the single crystal silicon substrate 131 is very narrow. If fragments of the sacrificial raised layers 138 which are separated from the substrate are jammed into these narrow spaces, the movable parts may become inoperable or there results adverse influences upon the characteristic of the micro-optic device, leading to a degraded yield.

It is known that the rough silicon surfaces on the opposite sidewall surfaces of the mirror portion 115a which are formed by the deep anisotropic reactive ion dry etching may be thermally oxidized to form an oxide film of a thickness which is large enough compared with the small unevenness of the rough silicon surface, and the oxide film may be etched with a fluoric acid (HF) to provide a mirror surface of a reduced roughness (see non-patent literature: W. H. Juan and S. W. Pang, "Controlling sidewall smoothness for micromachined Si mirrors and lenses", J. Vac. Sci. Technol. B14(6), November/December 1996, pp. 4080-4084).

However, with this technique, a time interval required to form an oxide film which is sufficiently thick with respect to the minute unevenness of the surface by the thermal oxidation is as long as ten hours, for example, requiring an increased manufacturing time for a micro-optic device, resulting in a high cost of the optical device.

This problem is not limited to the micro-optic switch, but a similar problem occurs when a micro-optic device including a mirror and a complicate structure other than the mirror is subject to a gas reactive, anisotropic dry etching to effect a deep etching reaction perpendicular to the surface of the substrate.

SUMMARY OF THE INVENTION

It is an object of the present invention to provide a micro-optic device including a mirror having a smooth mirror surface which can be manufactured in a relatively reduced length of time and with a good yield, and a method of manufacturing same.

In the micro-optic device according to the present invention, a mirror has a mirror surface which represents either (100) plane or (111) plane which is perpendicular to the sheet surface of a single crystal silicon substrate. The mirror surface as well as surfaces of structures other than the mirror are sidewall surfaces perpendicular to the sheet surface of the substrate or surfaces which are parallel to the sheet surface of the substrate.

According to the manufacturing method of the invention, an SOI substrate is provided which includes an upper and a lower single crystal silicon layer with an intermediate insulating layer, a mask layer is formed on the top surface of the upper layer, and a mask is formed by patterning the mask layer by photolithography so as to define a mirror forming surface which is perpendicular to the sheet surface of the upper single crystal substrate and which is aligned with either (100) plane or (111) plane and other sidewall surfaces which are perpendicular to the sheet surface of the substrate;

on the basis of the mask thus formed, the upper substrate which is not masked is removed by the gas reactive anisotropic dry etching until the intermediate insulating layer becomes exposed;

of the sidewall surfaces which are exposed by the dry etching applied to the upper substrate, a surface which is aligned with either (100) plane or (111) plane is smoothened by a wet etchant solution which is anisotropic with respect to silicon;

and of the smoothened surfaces which align with either (100) plane or (111) plane, a surface which is to be formed as a mirror surface is coated with a metal having a high reflectivity.

According to the present invention, the mirror surface represents either (100) plane or (111) plane, but other vertical sidewall surfaces of the optical device structure are not restricted in this manner, allowing surfaces which do not align with (100) plane or (111) plane or other crystallographic surface to remain. Accordingly, a deep etching by the anisotropic gas reactive dry etching may be applied to the single crystal silicon substrate so that the mirror surface is aligned with either (100) plane or (111) plane to form a minute structure having a complicate configuration. Subsequent to the deep etching, an etching is performed using a solution which exhibits anisotropy with respect to the crystalline orientation, whereby higher order surfaces which are subject to a rapid etching rate are quickly etched and a mirror surface becomes a crystallographic surface which is aligned with either (100) plane or (111) plane to provide a smooth mirror surface having an unevenness on the order of 10 nm or less while allowing the time interval for the wet etching to be reduced. Because sacrificial raised layers are not formed and are not required to be removed, there is no likelihood that the response may be degraded, resulting in a better yield.

BRIEF DESCRIPTIONS OF THE DRAWINGS

Figure 1:
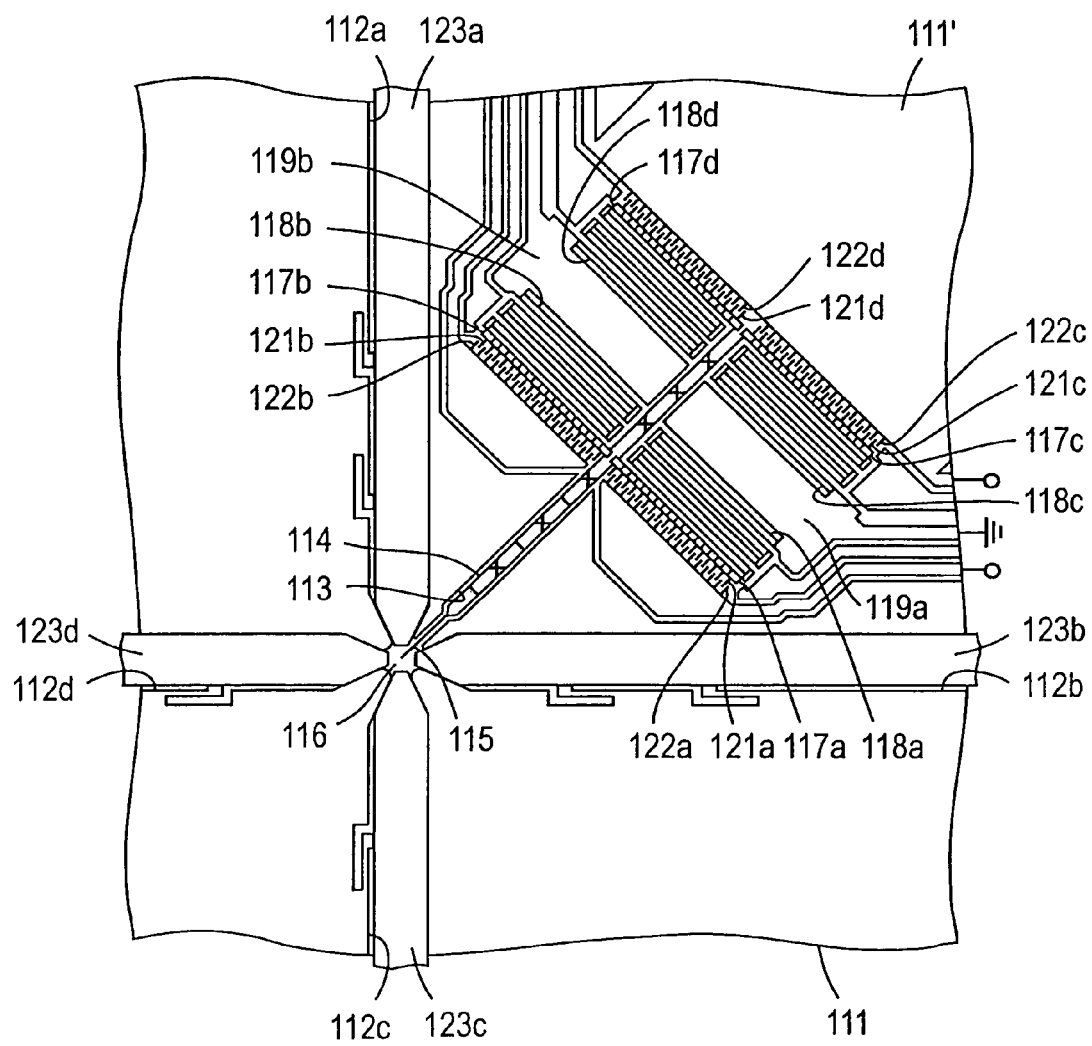
FIG. 1 is a plan view of a conventional micro-optic switch.
Figure 2A:
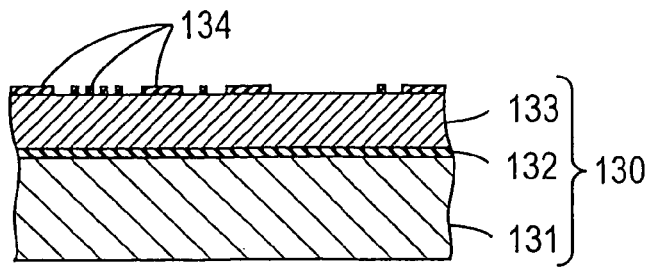
FIGS. 2A to 2C are partial cross sections schematically illustrating several steps of a method of manufacturing the micro-optic switch shown in FIG. 1.
Figure 2B:
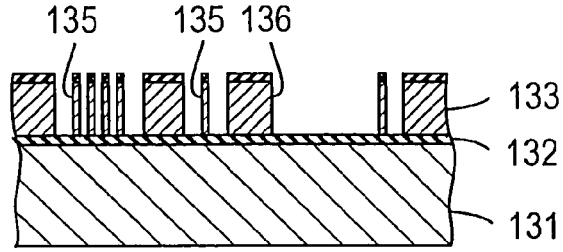
Figure 2C:
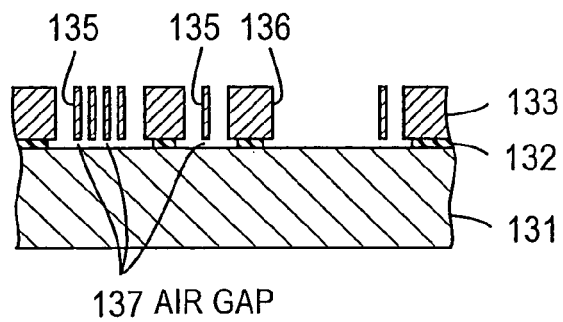
Figure 3A:
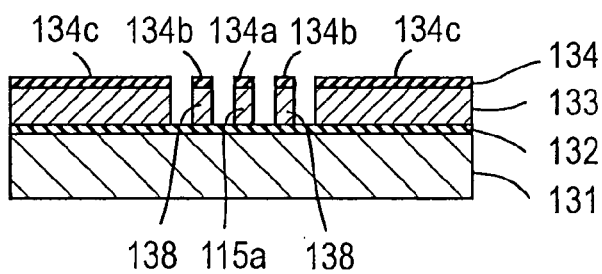
FIGS. 3A and 3B are schematic cross sections showing several steps of another method of manufacturing a conventional micro-optic switch.
Figure 3B:
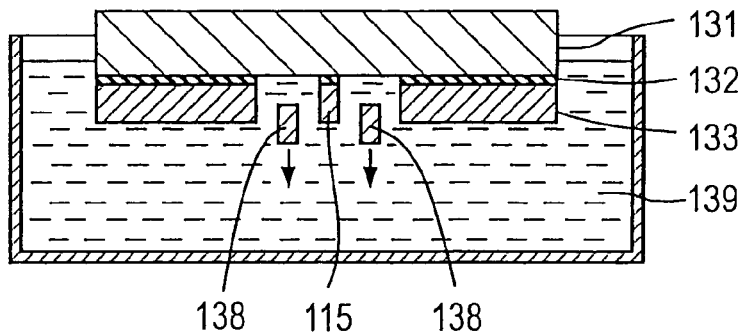
Figure 4:
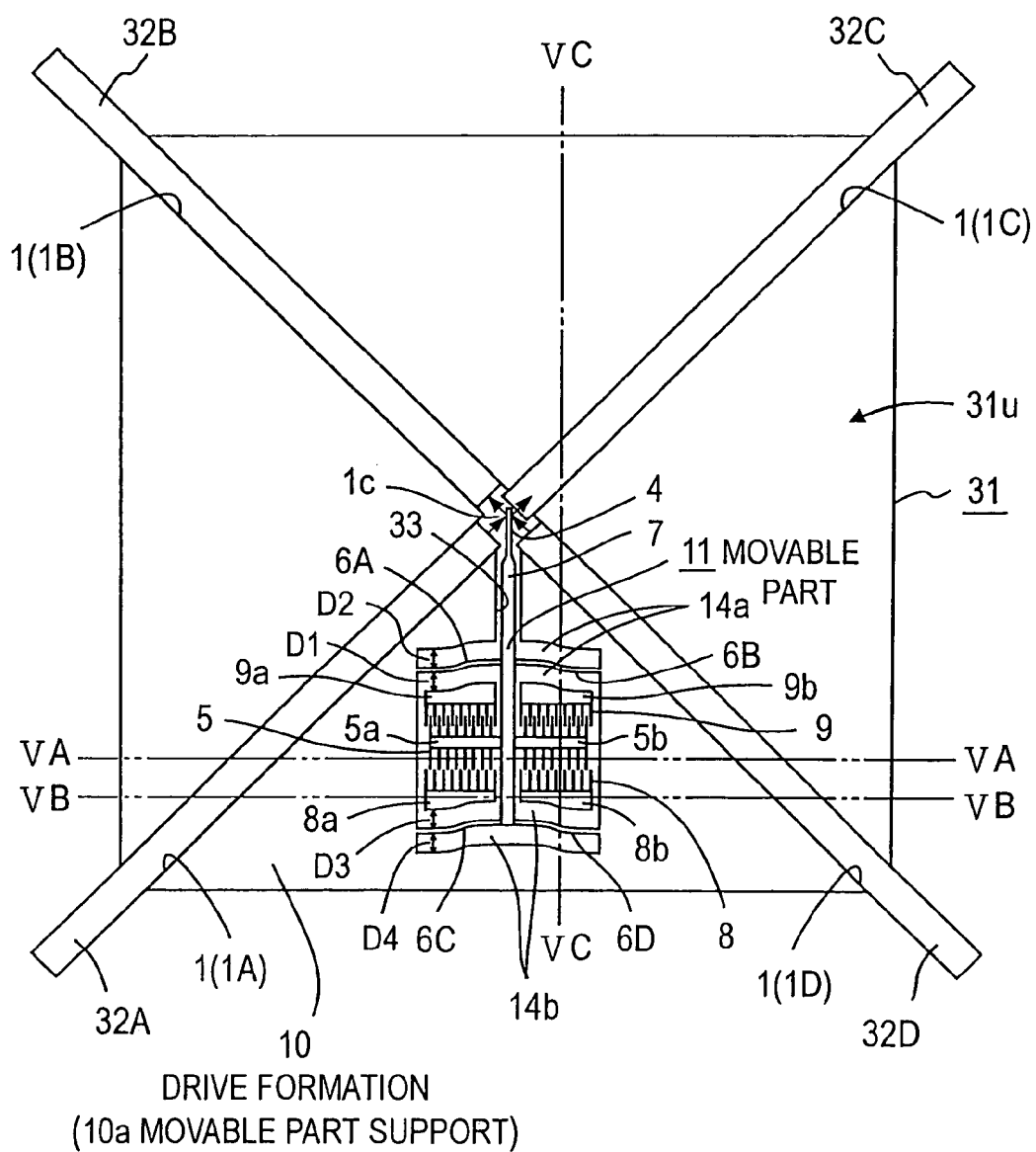
FIG. 4 is a plan view of an embodiment of the present invention.
Figure 11:
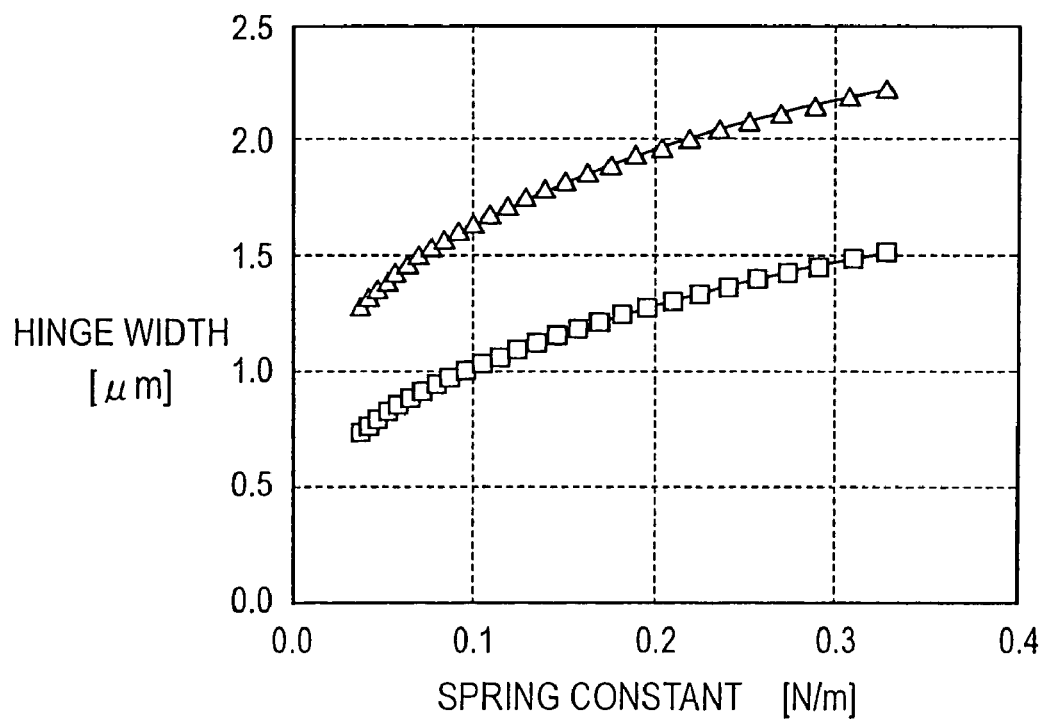
Figure 12:
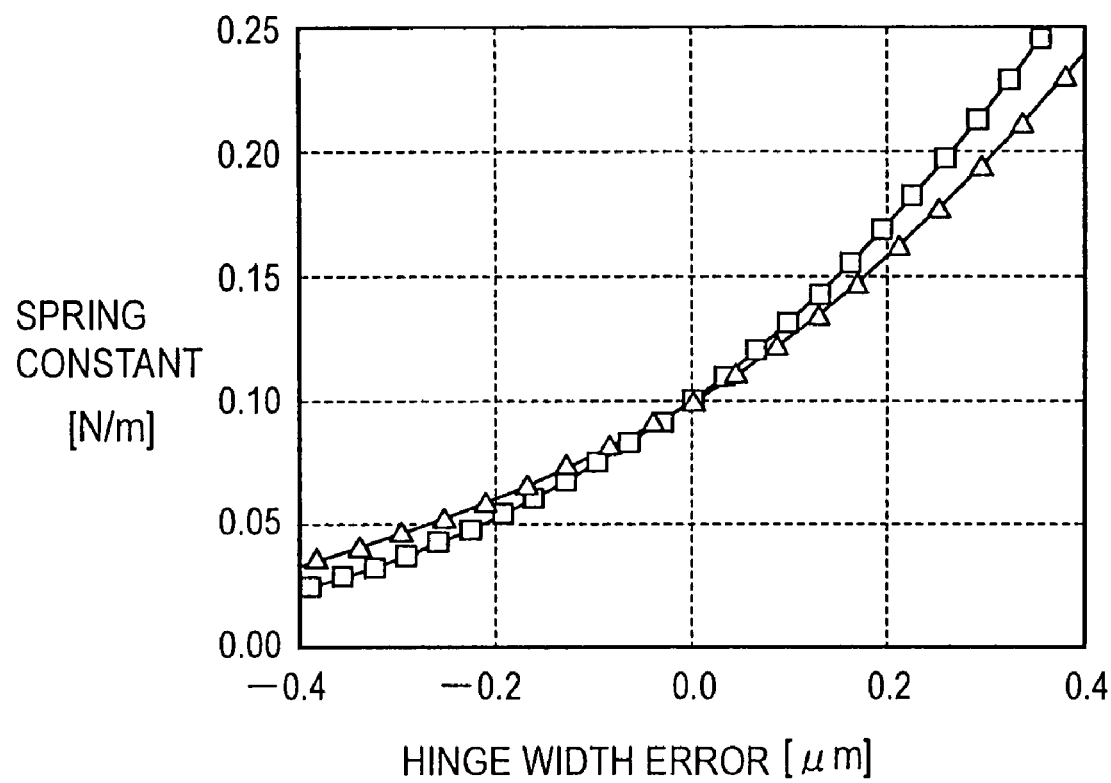
Figure 13A:
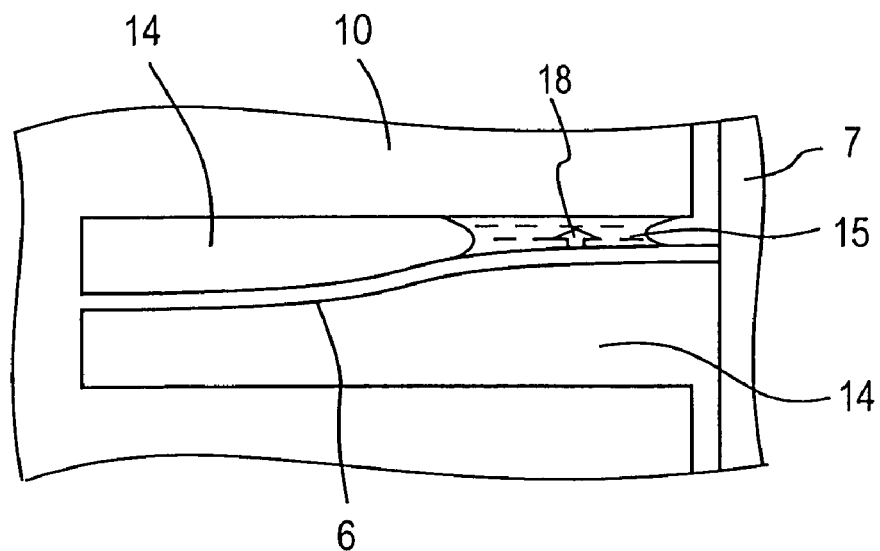
Figure 13B:
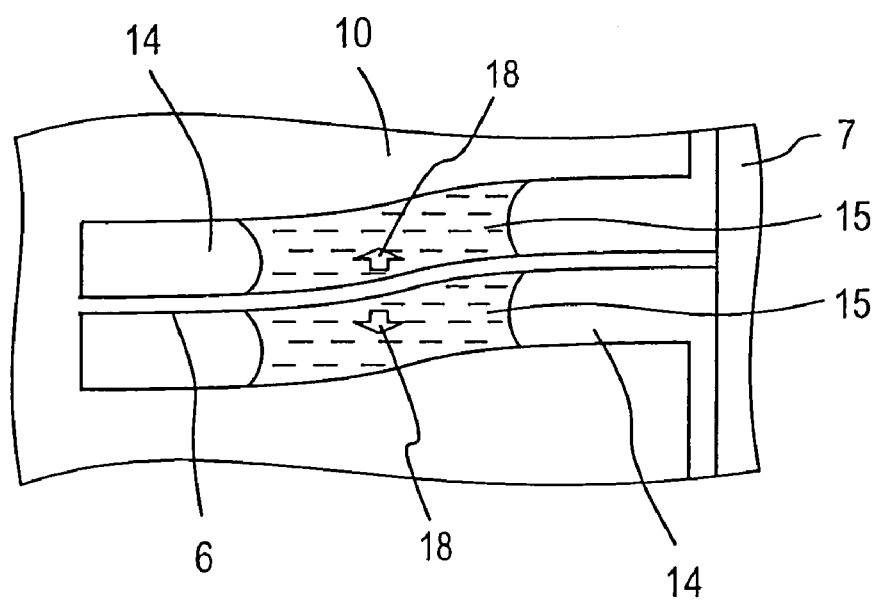

FIG. 11 graphically shows characteristic curves illustrating exemplary relationships between the hinge width and the spring constant of the leaf spring hinge;

FIG. 12 graphically shows characteristic curves illustrating exemplary relationships between the hinge width error and the spring constant of the leaf spring hinge;

FIG. 13A shows a condition that the leaf spring hinge may be held attracted to a wall surface of a hinge recess by the action of a liquid which remains during a drying step which follows the wet etching;

FIG. 13B shows a condition that the leaf spring hinge cannot be held attracted to a wall surface of the hinge recess by the action of a liquid which remains during the drying step which follows the wet etching; and FIGS. 14A to 14D are cross sections taken along the line VA-VA shown in FIG. 4, illustrating several steps of the method according to the invention which is applied to manufacture a structure including a mirror of the optical device shown in FIG. 4.

MODE OF CARRYING OUT THE INVENTION

An embodiment of the present invention applied to the micro-optic switch will now be described below with reference to the drawings. In the description to follow, it should be noted that throughout the drawings, corresponding parts are designated by like reference numbers without their repeated description.

As shown in plan view in FIG. 4 and in cross sections in FIG. 5, an SOI three layer structure includes a sheet-like single crystal silicon substrate 31 having a top surface 31u in which fiber channels 1 are formed in a crisscross configuration. Four fiber channels 1A to 1D extend radially from the center 1c of an area of intersection between the crisscross fiber channels 1, and optical fibers 32A to 32D are inserted into the respective fiber channels. As shown in FIG. 6, the width of fiber channels 1A to 1D is defined so close to diameters of optical fibers 32A-32D that the fibers pressed into channels are fixed within the channels, and the end face of each optical fiber is disposed in abutment against an abutment projection 3 which projects from the sidewall near the center 1c of the respective fiber channel 1A to 1D, whereby the optical fibers 32A to 32D are positioned relative to the substrate 31. In this example, the end face of each optical fiber 32A to 32D which is located toward the center 1c is beveled and abraded at an angle of 6°, for example, with respect to a plane which is perpendicular to the axis of the fiber to function as a collimation fiber.

As shown in FIG. 4, one of four areas on the top surface 31u of the substrate 31 which are divided by the fiber channels 1 arranged crisscross defines a drive formation 10, in which a rod channel 33 communicating with the center 1c is formed at an angle of 45° with respect to each of the fiber channels 1A and 1D so as to bisect the angle therebetween. A movable rod 7 is disposed in the rod channel 33, and the movable rod 7 carries a mirror 4 at its end disposed toward the center 1c. Leaf spring hinges 6A to 6D are connected to the movable rod 7 at two locations on each side to support the movable rod 7 so as to be movable in the lengthwise direction thereof with a movable path support 10a. In the example shown, each of the leaf spring hinges 6A to 6D is slightly flexed in its major plane centrally, allowing the hinge to assume two stable states which have reversed flexures.

A comb tooth type electrostatic actuator is provided between the hinges 6A, 6C and the hinges 6B, 6D. Specifically, support arms 5a and 5b have their one end secured to the opposite sides of the movable rod 7 and a movable comb tooth electrode 5 is formed on the support arms 5a and 5b toward the leaf spring hinges 6A and 6B and toward the leaf spring hinges 6C and 6D. A first and a second fixed comb tooth electrode 8 and 9 are secured to fixing parts 8a, 9a and 8b, 9b of the drive formation 10 which are disposed toward the hinges 6C and 6D and toward the hinges 6A and 6B of the movable comb tooth electrode 5. As shown to an enlarged scale in FIG. 7, comb teeth on the movable comb tooth electrode 5 and the first and the second fixed comb tooth electrode 8 and 9 are related such that the both comb tooth electrodes 5 and 8 and 9 can mesh with each other. The mirror 4, the movable comb tooth electrode 5, the associated support arms 5a and 5b and the movable rod 7 constitute together a movable part 11, which is retained by the leaf spring hinges 6A to 6D to be movable on the movable part support 10a. As will be described later, the fixing parts 8a, 8b and 9a and 9b are electrically insulated from the movable part support 10a which is connected to the leaf spring hinges 6A to 6D.

In the present embodiment, the both lateral surfaces of the mirror 4 or the mirror surfaces 4M (FIG. 6) are perpendicular to the sheet surface of the sheet-like substrate 31 or the top surface 31u and is aligned with the crystallographic plane (100) of the single crystal silicon. An exposed surface which is either parallel or orthogonal to the mirror surface 4M of the micro-optic switch and which is perpendicular to the top surface 31u represents the crystallographic plane (100) of the silicon, but other vertical surfaces do not represent (100) plane. The top surface 31u of the sheet-like substrate 31 represents (100) plane.

Figure 7:
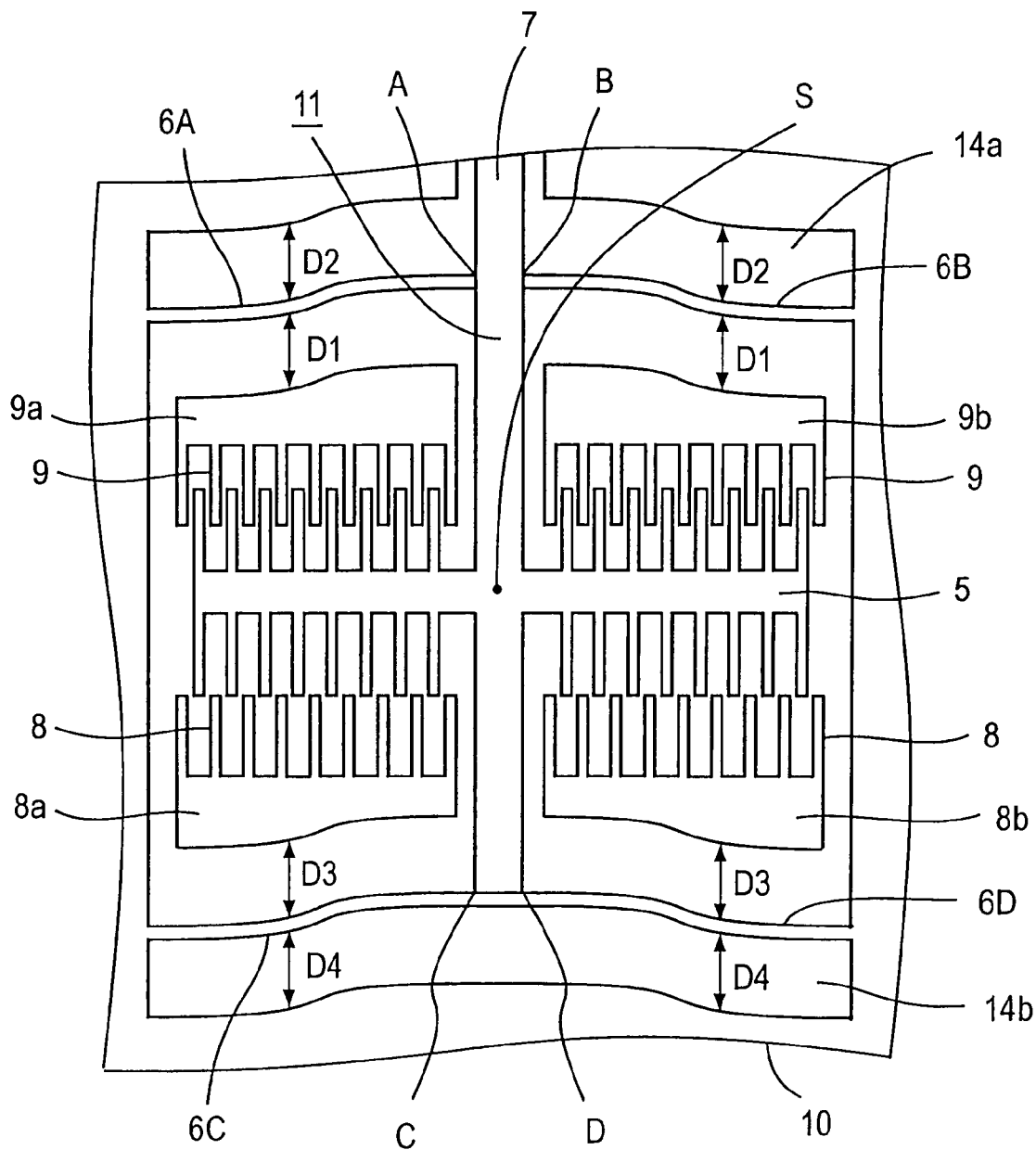
FIG. 7 is a plan view, to an enlarged scale, illustrating the construction of a movable comb tooth electrode and a fixed comb tooth electrode of the optical device shown in FIG. 4.
Figure 8A:
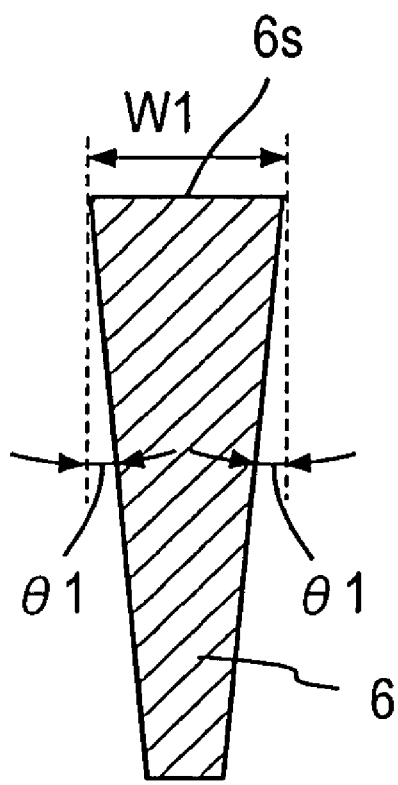
FIGS. 8A and 8B are cross sections, to an enlarged scale, of an exemplary leaf spring hinge used in the optical device shown in FIG. 4.
Figure 8B:
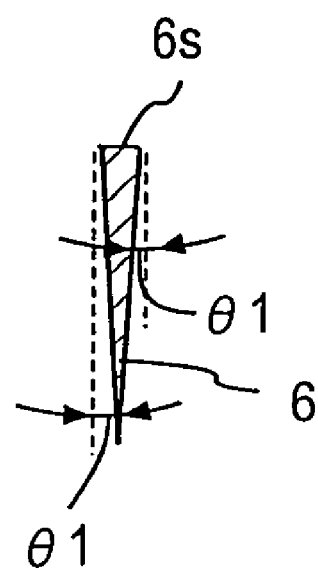
Figure 9:
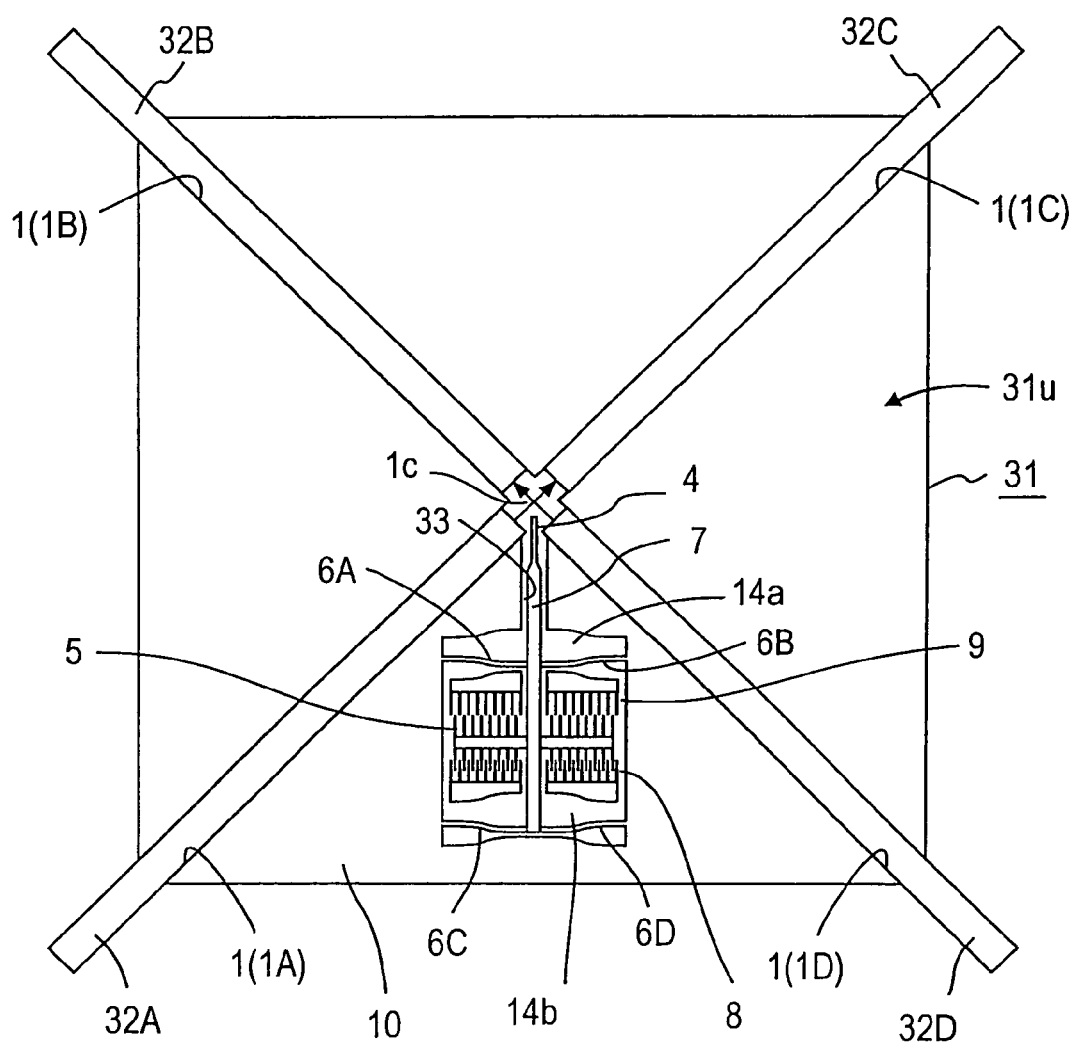
FIG. 9 is a plan view illustrating a condition that a mirror is extracted from the center 1c of fiber channels in the optical device shown in FIG. 4.

As shown in FIG. 7, the leaf spring hinges 6A, 6B and 6C, 6D are disposed within hinge recesses 14a and 14b, respectively, which are formed in the drive formation 10. Every surface which defines the outer profile of structures other than the mirror 4, namely, the movable comb tooth electrode 5, the movable rod 7, the hinges 6A to 6D, and the first and the second fixed comb tooth electrode 8 and 9 is either a sidewall surface perpendicular to the sheet surface of the substrate (top surface 31u) or a surface parallel to the top surface 31u. In the initial condition which prevails immediately upon manufacture of the optical device, it is preferred that wall surfaces of the hinge recesses 14a and 14b which are located opposite to the sheet surface of the leaf spring hinges 6A to 6D be parallel to oppositely located hinges 6A, 6B or 6C, 6D. Denoting a spacing between the leaf spring hinges 6A and 6B and the fixing part 9a and 9b of the second fixed comb tooth electrode 9 and a spacing between the same hinges and fixing parts disposed on the opposite side from the fixing parts 9a and 9b by D1 and D2, respectively, and denoting a spacing between the leaf spring hinges 6C and 6D and the fixing part 8a and 8b of the first fixed comb tooth electrode 8 and a spacing between the same leaf spring hinges and fixing parts disposed on the opposite side from the fixing parts 8a and 8b by D3 and D4, respectively, it is desirable that these spacings be equal to each other or D1=D2=D3=D4. In addition, as shown in FIGS. 8A and 8B, the cross-sectional configuration of the leaf spring hinges 6A to 6D is preferably such that the opposite side surfaces are inclined slightly, for example, on the order of θ1=0.5° with respect to a plane perpendicular to the sheet surface of the substrate 31u, and it is preferred that the width is gradually reduced from the surface 6s (top surface 31u) toward the inner surface. The cross-sectional configuration of the leaf spring hinges 6A to 6D may be trapezoidal having a broader top side relative to the base as shown in FIG. 8A or may be in the form of a wedge-shaped triangle as shown in FIG. 8B.

When the optical device has an initial configuration (which is hereafter referred to as a first stable state) which is assumed immediately after it has been manufactured, the mirror 4 is located at the center 1c, as shown in FIG. 4. At this time, light emitted from the optical fiber 32A is reflected by the mirror 4 to impinge on the optical fiber 32B. Light emitted from the optical fiber 32D is reflected and then impinges on the optical fiber 32C. The movable comb tooth electrode 5 is electrically connected to the movable part support 10a through the movable rod 7 and the leaf spring hinges 6A to 6D, and when a voltage is applied to the first fixed comb tooth electrode 8 while the movable part support 10a and the second comb tooth electrode 9 are connected to the ground, there occurs an electrostatic force of attraction between the first fixed comb tooth electrode 8 and the movable comb tooth electrode 5. If this force is greater than the force which tends to retain the first stable state, the leaf spring hinges 6A to 6D reverse to the second stable state, and are maintained in this state by a self-holding action if the voltage ceases to be applied. In this condition, the mirror 4 is retracted from the center 1c, and light emitted from the optical fibers 32A and 32B impinge on the optical fibers 32C and 32D, respectively. When a voltage is applied to the second fixed comb tooth electrode 9 while the movable part support 10a and the first fixed tooth electrode 8 are connected to the ground, there occurs an electrostatic force of attraction between the second fixed comb tooth electrode 9 and the movable comb tooth electrode 5, and if this force is greater than the force which tends to retain the second stable state, the hinges revert to the first stable state again. To apply a voltage across the first or the second fixed comb tooth electrode 8 or 9 and the movable electrode 5, bonding wires may be connected to the fixing parts 8a and 8b or 9a and 9b of the first or the second fixed comb tooth electrode, and the voltage may be applied across these bonding wires and the movable part support 10a. Optical fibers 32A and 32B or 32C and 32D are given as an example of an optical path formation in which extensions of optical paths intersect with each other on the mirror surface of the mirror 14.

It will be noted from FIG. 7 that the optical device is constructed so that except for the mirror 4, the movable part 11 exhibits an axial symmetry with respect to a center line parallel to the direction in which the mirror is driven (or the center line of the movable rod 7) and that points A, B, C and D where the movable rod 7 is supported by four leaf spring hinges 6A, 6B, 6C and 6D (namely, where hinge reactions act) are disposed symmetrically with respect to the connection between the movable comb tooth electrode 5 and the movable rod 7 (or point S where the driving force acts). In addition, the point S where the driving force acts is designed to be substantially in coincidence with the center of gravity of the movable part 11. As a result of such structural construction, if a driving force from the actuator contains a vector component directed in a direction different from a direction in which the movable part is to be driven, the four leaf spring hinges 6A, 6B, 6C and 6D provide an equal reaction to the unnecessary vector component in the driving force, thereby allowing an unintended movement of the movable part 11 in a direction other than a desired drive direction to be effectively suppressed.

If an external disturbance such as impact is applied, two structural features that 1) the four leaf spring hinges 6A, 6B, 6C and 6D are disposed at positions which are symmetrical with respect to the center of gravity of the movable part 11 and that 2) the movable comb tooth electrode 5 which represents a heavy structure is supported by the four leaf spring hinges 6A, 6B, 6C and 6D in an equal manner allow an unintended movement of the movable part 11 to be effectively suppressed.

Since the opposite surfaces of the leaf spring hinges 6A to 6D are formed by slightly inclined tapered surfaces, reducing the width toward the inside (or as further removed from the surface), the width of the hinges 6A to 6D on the surface which is required to provide a given spring constant can be increased than when the cross section is rectangular, and this facilitates the implementation of the photolithography applied when forming the mask while reducing the manufacturing errors.

Specifically, the mechanical rigidity of the leaf spring hinges 6A to 6D is proportional to the third power of the thickness of the hinge, and accordingly, the thickness of the hinges 6A to 6D has a great influence on the dynamic response of the movable part 11. For this reason, in order to allow an appropriate switching voltage to be obtained, it is necessary that the thickness of the hinges 6A to 6D be machined to a very thin configuration on the order of 1 μm, for example, requiring a very high manufacturing accuracy. However, it is difficult to achieve a satisfactory final finish configurational accuracy in this region of sizes.

Figure 10:
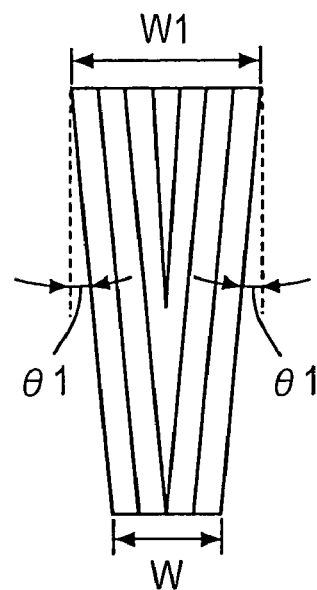
FIG. 10 illustrate enlarged cross sections of various widths of leaf spring hinges in superimposed relationship.

The cross-sectional configuration of the spring hinge 6 is assumed to have a given value (0.5°, for example) for the angle of inclination θ1 for the tapered side surface, as shown in FIG. 10. FIG. 11 graphically shows a relationship between the spring constant and the hinge width W1 as measured on the surface 6s, and FIG. 12 graphically shows a relationship between a hinge width error and the spring constant for spring hinges 6 having a trapezoidal or a triangular cross section and having various values for the width W1 or and for spring hinges having a rectangular cross section and having the same width and the height as the spring hinges 6. In FIG. 11, the abscissa represents the spring constant and the ordinate the hinge width W1, and in FIG. 12, the abscissa represents a hinge width error and the ordinate the spring constant. In both Figures, a triangle mark Δ represents a hinge having a trapezoidal or triangular cross section and a square mark □ represents a hinge having a rectangular cross section.

It is seen from FIG. 11 that for the same spring constant, a hinge having a trapezoidal or triangular cross section can have a width W1 which is by 0.6 μm or more greater than a corresponding width of a hinge having a rectangular cross section. It is also seen from FIG. 12 that as an error in the hinge width W1 increases, the rate of a change in the spring constant is less in the hinge having a trapezoidal or triangular cross section than in the hinge having a rectangular cross section, and accordingly, a greater design allowance is permitted to the hinge having a trapezoidal or triangular cross section for an equal error of the spring constant.

As mentioned above, it is preferred that the cross section of the leaf springs 6A to 6D be in the form of an inverted trapezoid or an inverted isosceles triangle with an angle of inclination of the lateral side on the order of 0.5°. However, the inclination of the lateral side of the leaf springs 6A to 6D is achieved by the dry etching at the same time as the mirror surface is formed. Light loss caused by the inclination of the mirror surface 4M depends on the diameter of a light beam. The light beam is throttled by a collimation fiber formed at the inner end of each of the optical fibers 32A to 32D and assumes a minimum diameter (beam waist diameter) on the mirror surface 4M. A light beam emitted from a single mode optical fiber has a waist diameter on the order of 2.0 to 30.0 μm. Light loss in an optical switch is attributable to a variety of factors, and a realistic permissible loss which is attributable to the inclination of the mirror surface 4M is on the order of 0.1 to 0.3 dB.

A calculation of light loss caused by the inclination of the mirror surface for an optical wavelength of 1.55 μm and a horizontal angle of incidence of 45° yields a maximum permissible loss of 0.3 dB at the minimum beam waist diameter of 2.0 μm for an angle of inclination $\theta 1$ equal to 5.25°. On the other hand, an angle of inclination $\theta 1$ which yields the minimum permissible loss of 0.1 dB at the maximum beam waist diameter of 30.0 μm is equal to 0.20°. Consequently, a realistic angle of inclination $\theta 1$ for the lateral side of the leaf springs 6A to 6D lies in a range from nearly 0.2° to 5.0°, preferably nearly 0.5°.

During the drying step which follows the wet etching during the manufacturing of the optical device, as the etchant becomes vaporized, the etchant tends to be collected in a narrow region due to the action of the surface tension of the etchant, and this is likely to cause an inconvenience that the movable part is held attracted to the fixing part by the surface tension of the liquid and remains fixed thereto under the influence of van der Waals force when the drying step is completed. Such difficulty can be prevented by a technique in which the etching solution is replaced by a liquid which is susceptible to sublimation under a reduced pressure, and the liquid is solidified at a temperature on the order of 25° C., for example, to promote the sublimation of the resulting solid under a reduced pressure, by a supercritical drying process in which the etching solution is replaced by a liquefied carbon dioxide ($CO_2$) and the drying step is continued in an environment of an elevated temperature and high pressure which does not accompany a state change from the liquid phase to the gas phase, or by a technique in which the etching solution is simply replaced by another liquid having a reduced surface tension for performing the drying step. Of these choices, it is simple to perform the drying step using a liquid having a reduced surface tension, but this has a drawback that the reliability is unwarranted.

To avoid this problem, it may be contemplated to increase the mechanical rigidity of the leaf spring hinge to a degree which makes it to be hardly attracted. However, the rigidity of the leaf spring hinges 6A-6B cannot be increased in consideration of the relationship with the drive voltage, and the attraction is likely to occur. It is found that this is attributable to the reason mentioned below. Flexed leaf spring hinges 6A to 6D are used in order to allow the movable part 11 to assume the first and the second stable state. Accordingly, when the hinge recess 14 is made in the form of a rectangle having a lengthwise direction which is substantially aligned with the lengthwise direction of the leaf spring hinge, the sheet surface of the leaf spring hinge 6 and the oppositely located wall surface of the hinge recess 14 may be widely spaced or closely spaced, giving rise to an offset in the timing of vaporization of the liquid during the drying step. In the closely spaced region, the vaporization of the liquid 15 may be retarded and the surface tension of the remaining liquid 15 (indicated by arrow 18) causes the hinge 6 to be attracted to the wall surface of the recess 14.

However, when the configuration of spaces on the opposite sides of the leaf spring hinges 6A to 6D or the spacing between the sheet surface of the hinge and the wall surface of the recess is made uniform as in the example shown in FIGS. 4 and 7, the amount of the liquid 15 which has undergone a retarded vaporization becomes equal on the opposite sides of the hinge, as shown in FIG. 13B, and accordingly, the magnitude of the surface tension of the liquid 15 which remains on the opposite sides will be substantially equal to each other, preventing the hinge from being held attracted. In this manner, by providing an equal spacing between the hinge and the wall surfaces of the recess which are located on the opposite sides of the hinge, a direct drying step from a simple and convenient liquid can be reliably performed.

As will be apparent from the illustrations in FIGS. 4 and 5A to 5C and related descriptions, in the embodiment, surfaces constituting the mirror 14 and other structures or the movable part 11, the fiber channels 1A to 1D, inclusive of the mirror surfaces are sidewall surfaces perpendicular to the sheet surface of the substrate or surfaces parallel to the sheet surface of the substrate. In other words, the mirror and other structures have outer profiles which are formed by surfaces which are perpendicular to and which are parallel to the sheet surface of the substrate.

An example of the method of manufacturing the optical device shown in FIGS. 4 to 7 will now be described with reference to FIG. 14, which shows cross sections taken along the line VA-VA shown in FIG. 4 during several steps.

Figure 14A:
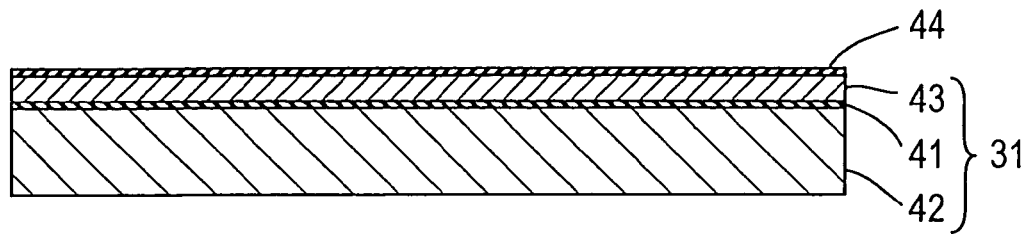

As shown in FIG. 14A, a sheet-like substrate formed by a pair of single crystal silicon layers 42 and 43 which are joined together through an intermediate insulating layer 41 or so-called SOI substrate 31 is provided. For example, the single crystal silicon layer 42 may comprise a single crystal silicon substrate having a thickness of 350 μm, on which a silicon oxide film 41 is formed as the intermediate insulating layer, and the single crystal silicon layer 43 is formed as a single crystal silicon device layer 43 to complete the substrate 31.

A layer of mask material 44 is formed on the substrate 31 or on top of silicon device layer 43. The mask material may comprise a silicon oxide film, for example.

Figure 14B:
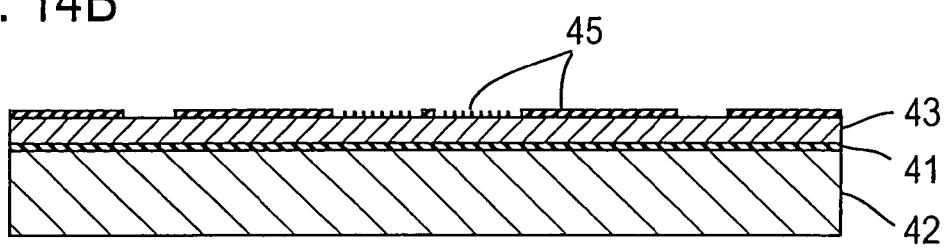

Using the photolithography, for example, the layer of mask material 44 is patterned to form a mask 45 as shown in FIG. 14B on top of the mirror 4, the hinges 6A-6D, the movable rod 7, the movable comb tooth electrode 5, the first and the second fixed comb tooth electrode 8 and 9 and on top of the substrate 31 excluding the fiber channels 1, the rod channel 33 and space (hinge recess 14) which does not influence upon the flexing operation of the leaf spring hinges 6A-6D, or according to a pattern which defines the mirror forming surface and side wall surfaces of structures other than the mirror surfaces which are perpendicular to the sheet surface of the substrate, which is the pattern configured as shown in FIG. 4 in this embodiment. The layer of mask material 44 is patterned so that the mirror surfaces of the mirror 4 are aligned with (100) plane of the single crystal silicon. For this reason, the SOI substrate 31 in which the top surface of the silicon device layer 43 represents (100) plane of the single crystal silicon is used.

Figure 14C:
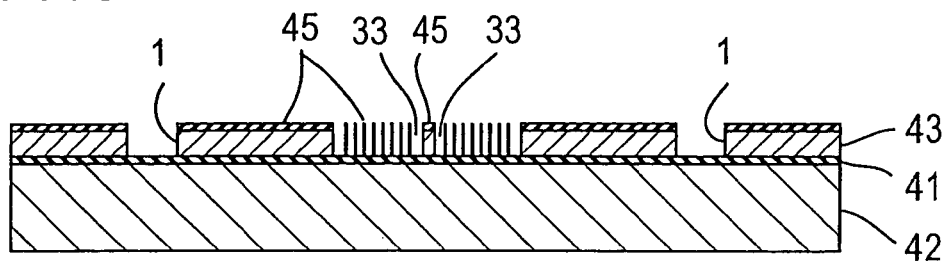
Figure 14D:
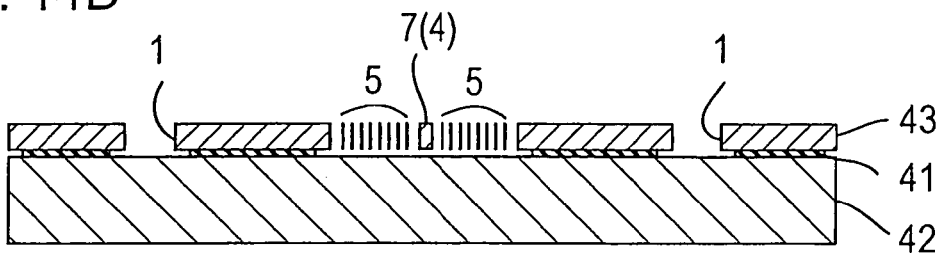

Subsequently, by ICP-RIE (Inductively Coupled Plasma-Reactive Ion Etching) dry etching, for example, the silicon device layer 43 is etched in a direction substantially perpendicular to the sheet surface of the sheet-like substrate 31 using the mask 45 until the intermediate insulating layer 41 becomes exposed as shown in FIG. 14C. This forms the fiber channels 1, the rod channel 33, the hinge recesses 14 and the comb teeth of the comb tooth electrodes.

After the surface of the silicon device layer 43 including the side walls which are formed by this etching operation is cleansed, it is immersed in a solution which exhibits an anisotropy of the etching rate with respect to the crystallographic orientation of the silicon and which has a reduced etching rate at room temperature, which may be on the order of 0.03 µm/min, for example, as exemplified by 8 mol/liter (8N) solution of potassium hydroxide (KOH) for an interval on the order of ten minuets at room temperature, thus applying a slight degree of wet etching to the sidewalls which are formed by the dry etching of the silicon device layer 43. An etchant solution for this purpose may also comprise an aqueous solution of ethylendiamine-pyrocatechol (EDP) or an aqueous solution of tetramethylammonium hydroxide (TMAH), and it is preferred that a solution having an etching rate on the order of 0.1 µm/min at room temperature be used.

Subsequently, the substrate is immersed in a selective etchant solution for the intermediate insulating layer 41 which may comprise a 50% solution of fluoric acid (HF) (or a mixed solution of hydrofluoric acid and ammonium fluoride) to etch the exposed intermediate insulating layer 41. An etching time interval is chosen so that the intermediate insulating layer 41 is completely removed in regions corresponding to the movable part 11 such as the mirror 4, the movable comb tooth electrode 5, the hinges 6A to 6D and the movable rod 7, but the intermediate insulating layer 41 is only marginally and slightly removed in regions corresponding to portions of the first and the second fixed comb tooth electrodes 8 and 9 except for the comb teeth which should remain fixed to the substrate 31. More specifically, the intermediate insulating layer 41 located between the silicon device layer 43 and the single crystal silicon substrate 42 is completely removed in narrow areas such as the mirror 4, the movable comb tooth electrode 5, the hinges 6A to 6D, the movable rod 7 and the comb teeth portions of the comb tooth electrodes 8 and 9, but the intermediate insulating layer 41 located between the silicon device layer 43 and the single crystal silicon substrate 42 is only marginally removed in wider areas such as the fixing parts 8a, 8b, 9a and 9b, the movable part support 10a.

As a result of this etching operation, the movable part 11 is supported on the substrate 31 in a movable manner by the leaf spring hinges 6A to 6D, and the first fixed comb tooth electrode 48 and its associated fixing parts 8a and 8b, the second fixed comb tooth electrode 9 and its associated fixing parts 9a and 9b and the movable part support 10a are electrically insulated from each other. In addition, in this example, during this etching operation, the mask 45 is simultaneously removed because the same material is used for the intermediate insulating layer 41 and the layer of mask material 44.

Figure 5A:
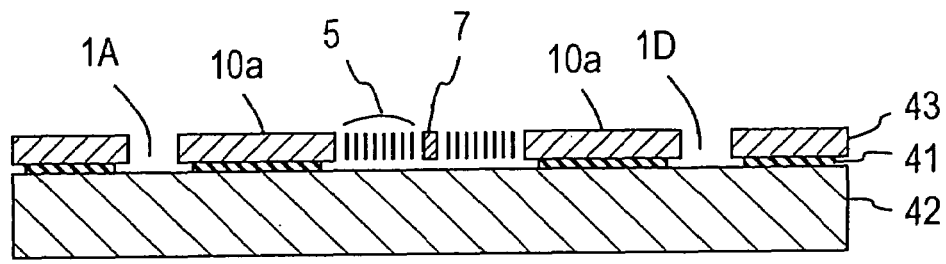
FIGS. 5A, 5B and 5C are cross sections of the optical device shown in FIG. 4, as taken along the lines VA-VA, VB-VB and VC-VC, respectively.
Figure 5B:
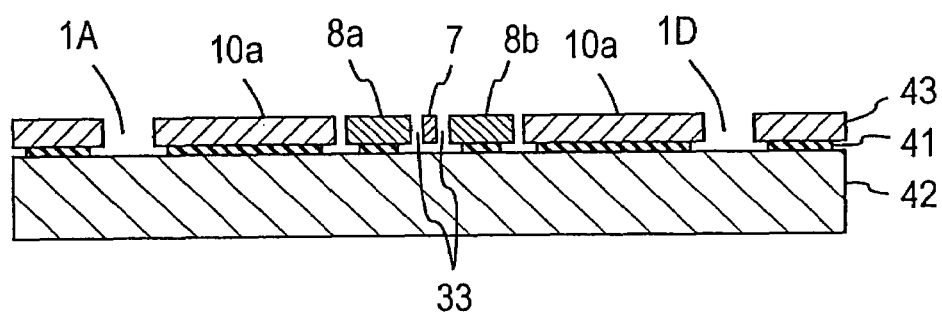
Figure 5C:
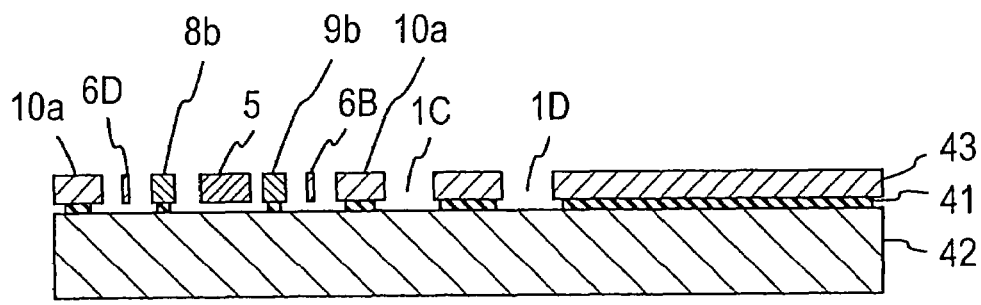
Figure 6:
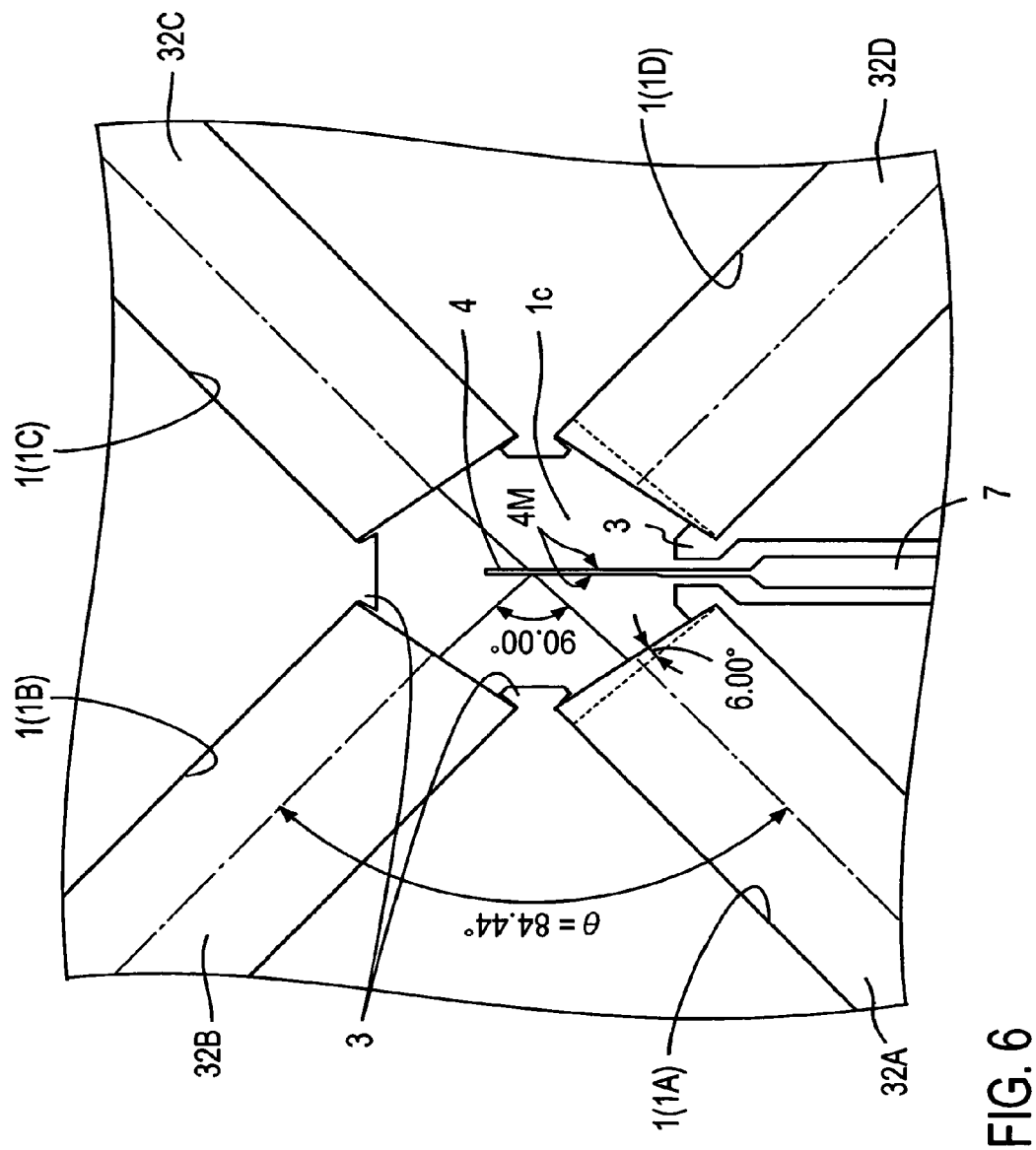
FIG. 6 is a plan view, to an enlarged scale, illustrating a construction of the optical device shown in FIG. 4 which is located in the vicinity of the center of fiber channels which are arranged crisscross.

The cross sections taken along the lines VA-VA, VB-VB and VC-VC after this etching operation appear as shown in FIGS. 5A, 5B and 5C where corresponding parts to those shown in FIGS. 4 and 14 are designated by like reference characters.

The anisotropic wet etching which takes place for a limited time interval with respect to the etched side walls of the silicon device layer 43 may follow the etching of the intermediate insulating layer 41 or the etching which makes the movable part to be movable.

It should be noted that the both of these etching operations represent a wet etching, and may take place in succession while changing the etching solution without interposing a drying step between the both etching operations.

After the deep, anisotropic dry etching has been applied to the silicon device layer 43, the etched sidewall surfaces are rough surfaces which can be regarded as an assembly of projections directed in random directions which do not depend on the crystallographic orientation of the silicon (higher order surface orientations). However, when an etching using an etchant solution such as potassium hydroxide which exhibits an anisotropy of etching rate with respect to the crystallographic orientation of the silicon is applied, higher order surfaces which are subject to a rapid etching rate are quickly etched. Since the both surfaces of the mirror 4 represent (100) plane of the silicon crystal, the anisotropic etching which depends on the crystallographic orientation converts the mirror surfaces into smooth surfaces having an unevenness in the direction of (100) plane of the silicon crystal on the order of 10 nm or less. The smoothed both surfaces of the mirror 4 are coated with a metal having a high reflectivity such as Au/Pt/Ti multilayer film as by sputtering, thus forming the mirror body.

The anisotropic wet etching applied to a single crystal silicon normally takes place by using KOH solution at a temperature on the order of 70° C. In this instance, the etching rate will be on the order of 1 µm/min, which is by two orders of magnitude greater than the reduced etching rate mentioned above, and when applied to the movable mirror 4 having a thickness of 2 µm, the etching time will be very short, and unless the etching time is precisely controlled, the mirror portion will be dissolved, making the control of the etching operation very difficult. However, this wet etching can take place very easily in accordance with the invention because it takes place at a reduced etching rate. While an etching rate on the order of 0.01 µm/min at room temperature is preferred, but it is not limited to such value. Since this choice is made because the etching rate on the order of 1.0 µm/min makes the etching control practically difficult, an etching rate which enables easy etching control may be chosen to be 0.05 µm/min at room temperature, for example, when a rapid etching is desired, but which may be on the order of 0.1 to 0.2 µm/min depending on the circumstance. If the etching rate is too low, it takes a longer wet etching time, which is not suitable for industrial purpose. Accordingly, an etching rate on the order of 0.001 to 0.005 µm/min at room temperature may be chosen as a slow etching operation while avoiding a significant retardation in the productivity.

Forming the both surfaces of the leaf spring hinges 6A to 6D as tapered surfaces can be achieved by an etching operation with adjusted etching conditions such that the sidewalls are slightly angled with respect to the perpendicular to the surface of the substrate to make the thickness of the hinge (the width of the cross section) reduced from the surface toward the intermediate insulating layer 41 during the deep dry etching operation. In this instance, the mirror surface of the mirror 4 or the crystallographic surface (100) will be slightly offset from the perpendicular relative to the surface of the substrate (sheet surface of the substrate) when strictly viwed, but if the offset is on the order of 0.5°, an influence upon optical performance is minimal. Throughout the specification, the sidewall surfaces which are formed by the deep anisotropic reactive ion dry etching are described to be perpendicular to the surface of the substrate (the sheet surface of the substrate) inclusive of such slight offset.

The anisotropic wet etching which is applied to the sidewall surfaces formed by the deep dry etching can also be utilized in a fine adjustment of the thickness of the leaf spring hinges 6A to 6D which has a great influence upon the dynamic response of the movable part 11.

In the above description, (100) plane is utilized as a surface which is subject to a slow etching rate, and (100) plane of the single crystal silicon has been chosen for the mirror surface of the mirror. However, an SOI substrate 31 having (110) plane as the top surface of the silicon device layer 43 may also be used so that the mirror has a mirror surface representing (111) plane and still the anisotropic wet etching may be used to provide a smooth mirror surface. If one of these planes is to be chosen, (100) plane is preferred.

In the above description, the present invention has been applied to a mirror drive as a complicate structure other than the mirror 4, but the application of the invention is not limited thereto, but the present invention is applicable to a micro-optic device in which a mirror and structures other than the mirror are formed by the deep anisotropic dry etching in which the mirror surface represents (100) plane or (111) plane of the single crystal silicon and is perpendicular to the sheet surface of the substrate and in which surfaces which forms the mirror and structures other than the mirror are defined by sidewall surfaces perpendicular to the sheet surface of the substrate or by surfaces parallel to the sheet surface of the substrate, thus including such device in which the mirror is fixed or in which the structures do not include a movable part, inclusive of the following examples:

As movable devices:

Variable Optic Attenuator (VOA) . . . substantially identical in construction to an optical switch, in which leaf spring hinges lack the function of a bistable operation, and instead of controlling the mirror in a binary movement, the mirror is continuously displaced in accordance with a drive voltage applied.

Resonator Type Variable Optical Filter . . . a pair of mirrors are disposed in opposing relationship to form a resonator, and at least one of the mirrors is made to be variable to change the spacing between the mirrors for changing the transmission wavelength characteristic of the resonator.

As static devices:

an optical module used for transmission and reception of signals including a mirror, an optical fiber, a semiconductor laser element, a light receiving element and a sheet-like optical filter element. Grooves and spot facings for mounting these elements are formed by the deep anisotropic reacting ion dry etching. A micro-optic device including a pressure mechanism having pressure springs (such as pressure spring 2 shown in FIG. 5) for positioning optical fibers and sheet-like optical filter elements.

What is claimed is:

1. A micro-optic device comprising a mirror and one or more structures other than the mirror each formed of a single crystal silicon layer, wherein the single crystal silicon layer has a top surface representing (100) silicon crystal plane or (110) silicon crystal plane and has recesses or channels with sidewall surfaces substantially perpendicular to the top surface;

every surface of the mirror and the one or more structures other than the mirror is formed either by a respective sidewall surface or a surface which is parallel to the top surface;

the mirror has a side surface which represents (100) silicon crystal plane or (111) silicon crystal plane and is substantially perpendicular to the top surface, and has unevenness less than that of other sidewall surfaces not representing (100) silicon crystal plane or (111) silicon crystal plane; and the side surface has a metal coating film forming a reflective surface.

2. The device according to claim 1, wherein there is provided a SOI substrate which comprises:

a first layer of single-crystal silicon, an insulating layer provided on an upper surface of the first layer, and a second layer of single-crystal silicon provided on an upper surface of the insulating layer; and the single-crystal silicon layer is the second layer of the SOI substrate.

3. A micro-optic device according to claim 2, wherein:

there are provided a movable part and stationary parts as the structures other than the mirror, the stationary parts are fixed through the insulating layer to the first layer of the SOI substrate, the movable part comprises a movable rod on which the mirror is mounted and a plurality of leaf spring hinges each having its one end secured to the movable rod and its other end secured to a respective stationary part so that the movable rod is held movable in parallel to the top surface by the stationary parts on the first layer of the SOI substrate, each leaf spring hinge has two side surfaces with a spacing between the two side surfaces increasing toward the top surface of the leaf spring hinge.

4. A micro-optic device according to claim 3 in which the two side surfaces of the leaf spring hinge form a narrow angle of 0.2° to 5.0° with a plane which is perpendicular to the top surface.

* * * * *